United States Patent
Endo et al.

(10) Patent No.: US 11,077,647 B2
(45) Date of Patent: Aug. 3, 2021

(54) THERMALLY CONDUCTIVE SILICONE RUBBER COMPOSITE SHEET

(71) Applicant: SHIN-ETSU CHEMICAL CO., LTD., Tokyo (JP)

(72) Inventors: Akihiro Endo, Annaka (JP); Yuki Tanaka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 351 days.

(21) Appl. No.: 16/313,795

(22) PCT Filed: Jul. 12, 2017

(86) PCT No.: PCT/JP2017/025348
§ 371 (c)(1),
(2) Date: Dec. 27, 2018

(87) PCT Pub. No.: WO2018/025600
PCT Pub. Date: Feb. 8, 2018

(65) Prior Publication Data
US 2020/0123427 A1    Apr. 23, 2020

(30) Foreign Application Priority Data

Aug. 5, 2016  (JP) .............................. JP2016-154228

(51) Int. Cl.
| | |
|---|---|
| B32B 27/28 | (2006.01) |
| C09D 7/61 | (2018.01) |
| C08J 7/044 | (2020.01) |
| C08J 5/18 | (2006.01) |
| C08J 7/04 | (2020.01) |
| C08K 3/22 | (2006.01) |
| C09D 5/00 | (2006.01) |
| C09D 183/04 | (2006.01) |
| C09K 5/14 | (2006.01) |
| H01L 23/373 | (2006.01) |
| C08J 7/043 | (2020.01) |

(52) U.S. Cl.
CPC .............. *B32B 27/281* (2013.01); *C08J 5/18* (2013.01); *C08J 7/042* (2013.01); *C08J 7/043* (2020.01); *C08J 7/044* (2020.01); *C08K 3/22* (2013.01); *C09D 5/00* (2013.01); *C09D 7/61* (2018.01); *C09D 183/04* (2013.01); *C09K 5/14* (2013.01); *H01L 23/3735* (2013.01); *H01L 23/3737* (2013.01); *C08J 2379/08* (2013.01); *C08J 2483/07* (2013.01); *C08K 2003/2227* (2013.01); *C08K 2201/001* (2013.01)

(58) Field of Classification Search
None
See application file for complete search history.

(56) References Cited

U.S. PATENT DOCUMENTS

| | | | |
|---|---|---|---|
| 10,538,665 | B2 | 1/2020 | Min et al. |
| 2004/0067372 | A1 | 4/2004 | Takei et al. |
| 2017/0233575 | A1* | 8/2017 | Min ........................ C08L 79/08 528/353 |

FOREIGN PATENT DOCUMENTS

| | | |
|---|---|---|
| CN | 101954766 A | 1/2011 |
| EP | 2 270 080 A1 | 1/2011 |
| EP | 2 308 676 A1 | 4/2011 |
| JP | 47-32400 A | 11/1972 |
| JP | 54-184074 U | 12/1979 |
| JP | 2-24383 A | 1/1990 |
| JP | 2004-122664 A | 4/2004 |
| JP | 2010-6890 A | 1/2010 |
| JP | 2011-25676 A | 2/2011 |
| JP | 2011-98566 A | 5/2011 |
| JP | 2015-231012 A | 12/2015 |
| TW | 201619303 A | 6/2016 |
| TW | I535760 B | 6/2016 |

OTHER PUBLICATIONS

Taiwanese Office Action and Search Report for Taiwanese Application No. 106124825, dated Jan. 12, 2021, with an English translation.
International Search Report for PCT/JP2017/025348 dated Aug. 15, 2017.
Written Opinion of the International Searching Authority for PCT/JP2017/025348 (PCT/ISA/237) dated Aug. 15, 2017.

(Continued)

*Primary Examiner* — Robert T Butcher
(74) *Attorney, Agent, or Firm* — Birch, Stewart, Kolasch & Birch, LLP

(57) ABSTRACT

Provided is an inexpensive thermally conductive silicone rubber composite sheet. The thermally conductive silicone rubber composite sheet of the invention includes a laminated structure body comprised of an intermediate layer and an outer layer laminated on both surfaces of the intermediate layer, in which (A) the intermediate layer is an electrical insulating synthetic resin film layer having a thermal conductivity of not lower than 0.20 W/m·K and a tensile elastic modulus of not lower than 5 GPa, and (B) the outer layer is a silicone rubber layer of a cured product of a composition containing: (a) an organopolysiloxane; (b) a curing agent; (c) a thermally conductive filler; and (d) a silicon compound-based adhesion imparting agent having at least one kind of group selected from the group consisting of an epoxy group, an alkoxy group, a methyl group, a vinyl group and a Si—H group.

19 Claims, No Drawings

(56) References Cited

OTHER PUBLICATIONS

Extended European Search Report dated Jan. 8, 2020, in European Patent Application No. 17836707.4
UBE Industries Ltd.: "UBE Polyimide Film Exhibits Industry Leading Heat Resistance," (Jan. 1, 2015), pp. 1-4.
Office Action dated Oct. 1, 2019, in Japanese Patent Application No. 2018-531807.
Office Action dated Mar. 16, 2020, in Chinese Patent Application No. 201780045198.7.
Taiwanese Office Action and Search Report for Taiwanese Application No. 106124825, dated Apr. 6, 2021, with English translation.

* cited by examiner

THERMALLY CONDUCTIVE SILICONE RUBBER COMPOSITE SHEET

TECHNICAL FIELD

The present invention relates to a thermally conductive silicone rubber composite sheet suitable as a heat dissipation member that is to be interposed between a heat-generating electronic part and a heat dissipation part such as a heat dissipation fin. Particularly, the composite sheet of the invention has a favorable electrical insulation property and thermal conductivity, and is capable of being easily employed in automatic mounting due to a high strength and rigidity thereof.

BACKGROUND ART

Conventionally, electrical insulating thermally conductive materials have been employed in heat dissipation members for use in heat-generating electronic and electric parts such as a power transistor, a MOS transistor, a FET, a thyristor, a rectifier and a transformer. Examples of these materials include a material (Patent document 1) prepared by adding to a synthetic rubber such as a silicone rubber a metal oxide powder such as a beryllium oxide powder, an aluminum oxide powder, an aluminum hydroxide powder, a magnesium oxide powder and a zinc oxide powder; and a material (Patent document 2) prepared by filling a silicone rubber with boron nitride and then reinforcing the same with a mesh-like insulation material.

Further, as a method for improving the thermal conductivity of the above heat dissipation members, the thicknesses thereof may be reduced as much as possible. However, an excessively reduced thickness causes a problem that the strength, durability and electrical insulation property of the heat dissipation members will be impaired. As a remedy to such problem, there has been proposed a multilayered structure body in which employed as an intermediate layer is a film with a high heat resistance, electrical insulation property and mechanical strength, such as an aromatic polyimide, a polyamide, a polyamideimide and polyethylene naphthalate; and employed as the outer layers(s) is a silicone rubber layer that contains, for example, beryllium oxide, aluminum oxide and/or aluminum hydroxide, and is thus superior in thermal conductivity and electrical property. For example, Patent document 3 discloses a thermally conductive electrical insulation member having a laminated body composed of at least three layers which are: an intermediate layer as a polyimide (amide) film containing a given amount of aluminum oxide or the like; and an outer layer that is arranged on both surfaces of such intermediate layer, and are actually silicone rubber layers also containing aluminum oxide or the like.

However, these thermally conductive electrical insulation members having multilayered structures have a problem that interlayer peeling may easily occur with time, and an impaired durability will thus be exhibited, due to an unstable adhesion between the silicone rubber layers as the outer layers and the film of an aromatic polyimide or the like as the intermediate layer.

As a remedy to this problem, there is known a thermally conductive silicone rubber composite sheet (Patent document 4) having a laminated structure body in which employed as the outer layer(s) is a silicone rubber layer prepared by curing a composition containing a silicon compound-based adhesion imparting agent having at least one kind of functional group selected from the group consisting of an epoxy group, an alkoxy group, a vinyl group and a Si—H group.

Meanwhile, in recent years, automatic mounting of thermally conductive silicone rubber composite sheets has been performed in a progressive manner, for the purpose of reducing costs and improving precision in quality control. In a general automatic mounting procedure, a thermally conductive silicone rubber composite sheet that has been trimmed to a particular shape is picked up in a way such that either the edge portion on one side thereof or the edge portions on both sides thereof is/are mechanically picked up; or that the composite sheet itself is picked up via vacuum suction, followed by having the composite sheet transported to and installed in a desired location. That is, if employed in automatic mounting, it is required that a thermally conductive silicone rubber composite sheet possess an adequate rigidity. If the rigidity is insufficient, there occurs a problem that the composite sheet cannot maintain its shape when picked up as a portion thereof that is not supported undergoes a deflection due to its own weight.

The intermediate layer needs to be thickened to impart a desired rigidity to a thermally conductive silicone rubber composite sheet. However, in general, the thermal conductivity of the intermediate layer is significantly lower than that of the thermally conductive silicone rubber layer as the outer layer, which has led to a problem that the thermal conductive property of the composite sheet as a whole will be largely impaired. Further, there has been heretofore considered employing, as the intermediate layer, a film filled with a filler and thus having an improved thermal conductivity (Patent documents 5 and 6). However, in such case, there exist problems that a tensile strength will decrease due to an insufficient rigidity and the fact that the film is filled with a filler, and that the sheet may thereby break when performing automatic mounting. In addition, there also exists a problem that a film filled with a filler may become extremely costly.

PRIOR ART DOCUMENT

Patent Document

Patent document 1: Japanese Unexamined Patent Application Publication No. Sho 47-32400
Patent document 2: Japanese Unexamined Utility Model (Registration) Application Publication No. Sho 54-184074
Patent document 3: Japanese Examined Patent Application Publication No. Hei 2-24383
Patent document 4: Japanese Unexamined Patent Application Publication No. 2004-122664
Patent document 5: Japanese Unexamined Patent Application Publication No. 2011-025676
Patent document 6: Japanese Unexamined Patent Application Publication No. 2011-098566

SUMMARY OF THE INVENTION

Problem to be Solved by the Invention

The present invention has a superior thermal conductivity and electrical insulation property. Further, it is an object of the invention to provide an inexpensive thermally conductive silicone rubber composite sheet suitable for use in automatic mounting due to a favorable adhesion between the intermediate layer and the outer layers, and a high durability, strength, flexibility and rigidity of the sheet as a whole.

Means to Solve the Problem

The inventors of the invention diligently conducted a series of studies, and completed the invention by finding that the following thermally conductive silicone rubber composite sheet was capable of solving the aforementioned problems.

That is, the present invention is to provide the following thermally conductive silicone rubber composite sheet.

[1]
A thermally conductive silicone rubber composite sheet including a laminated structure body comprised of an intermediate layer and an outer layer laminated on both surfaces of the intermediate layer, wherein
(A) the intermediate layer is an electrically insulating synthetic resin film layer having a thermal conductivity of not lower than 0.20 W/m·K and a tensile elastic modulus of not lower than 5 GPa, and
(B) the outer layer is a silicone rubber layer of a cured product of a composition containing: (a) an organopolysiloxane; (b) a curing agent; (c) a thermally conductive filler; and (d) a silicon compound-based adhesion imparting agent having at least one kind of group selected from the group consisting of an epoxy group, an alkoxy group, a methyl group, a vinyl group and a Si—H group.

[2]
The thermally conductive silicone rubber composite sheet according to [1], wherein the intermediate layer has a thickness of not smaller than 25 μm, and the thermally conductive silicone rubber composite sheet has a total thickness of not larger than 300 μm.

[3]
The thermally conductive silicone rubber composite sheet according to [1] or [2], wherein the intermediate layer has a tensile strength of not lower than 200 MPa.

[4]
The thermally conductive silicone rubber composite sheet according to any one of [1] to [3], wherein a synthetic resin used in the synthetic resin film is an aromatic polyimide, a polyamide, a polyamideimide, a polyester or a fluorine-based polymer; or a combination of two or more of them.

[5]
The thermally conductive silicone rubber composite sheet according to any one of [1] to [4], wherein a synthetic resin used in the synthetic resin film is a polyimide as a polycondensate of biphenyltetracarboxylic acid dianhydride and diamine.

[6]
The thermally conductive silicone rubber composite sheet according to any one of [1] to [5], wherein a powder as the thermally conductive filler is a zinc oxide powder, an aluminum oxide powder, a magnesium oxide powder, an aluminum hydroxide powder, a boron nitride powder, an aluminum nitride powder, a silicon oxide powder, a silicon carbide powder or a diamond powder; or a combination of two or more of them.

[7]
The thermally conductive silicone rubber composite sheet according to any one of [1] to [6], wherein the curing agent as the component (b) is an addition reaction-type curing agent utilizing hydrosilylation reaction, and the silicon compound-based adhesion imparting agent as the component (d) has any one or both of a vinyl group and a Si—H group; and any one or both of an epoxy group and an alkoxy group.

[8]
The thermally conductive silicone rubber composite sheet according to any one of [1] to [6], wherein the curing agent as the component (b) is an organic peroxide, and the silicon compound-based adhesion imparting agent as the component (d) has any one or both of a methyl group and a vinyl group; and any one or both of an epoxy group and an alkoxy group.

Effects of the Invention

The thermally conductive silicone rubber composite sheet of the invention is significantly superior in thermal conductivity due to the fact that the outer layer(s) thereof is a silicone rubber layer having a favorable thermal conductivity, and the intermediate layer thereof is a synthetic resin film layer superior in thermal conductivity. Further, since this intermediate layer is also superior in mechanical strength, its reinforcement effect imparts a sufficient strength and flexibility to the composite sheet of the invention. Furthermore, both the intermediate and outer layers employed in the present invention have a favorable electrical insulation property. For these reasons, the composite sheet of the invention is preferable as an electrical insulating heat dissipation member interposed between a heat-generating electronic/electric part and a heat dissipation part. Particularly, since the composite sheet of the invention is significantly superior in thermal conductivity, it is effective if the composite sheet is applied in a high-heat-generating object. Moreover, since the silicone rubber layer contains the adhesion imparting agent, the silicone rubber layer and the synthetic resin film layer are allowed to strongly adhere to each other, thereby bringing about a noticeable function and effect that the composite sheet of the invention has an excellent durability. In addition, since the composite sheet of the invention has a high rigidity, the shape thereof can be maintained such that the composite sheet can then be picked, transported and installed without any difficulty even when used in automatic mounting.

MODE FOR CARRYING OUT THE INVENTION

The present invention is described in detail hereunder. In the following description, the thermally conductive silicone rubber composite sheet of the invention may be referred to as "composite sheet." In this specification, the thermal conductivity of a synthetic resin film layer used as an intermediate layer of the invention is a value measured by a laser flash method at 25° C.

(A) Intermediate Layer

The intermediate layer of the composite sheet of the invention is a synthetic resin film layer having a superior heat resistance and electrical insulation property, a flexibility, a high mechanical strength, and a thermal conductivity of not lower than 0.20 W/m·K. When the thermal conductivity is lower than 0.20 W/m·K, the thermal conductive property of the composite sheet of the invention may be easily compromised.

Further, the tensile elastic modulus of the synthetic resin film used as the intermediate layer is not lower than 5 GPa, preferably not lower than 6 GPa. If such tensile elastic modulus is lower than 5 GPa, the composite sheet may easily deform when picked up in automatic mounting, which makes it difficult for the composite sheet to be used in automatic mounting. In the present invention, the tensile elastic modulus of the intermediate layer was measured in accordance with ASTM D 882.

It is preferred that the thickness of the intermediate layer be 25 to 100 μm, particularly preferably 50 to 100 μm. If the intermediate layer is so thick that the thickness thereof is greater than 100 μm, the thermal conductivity of the composite sheet of the invention may be impaired. Meanwhile, if the intermediate layer is so thin that the thickness thereof is smaller than 25 μm, the level of strength and rigidity to be exhibited by the intermediate layer may be insufficient, which makes it difficult for the composite sheet to be used in automatic mounting. Further, the electrical insulation property may be insufficient as a voltage resistance deteriorates due to such thinness. In addition, it is preferred that the intermediate layer be a holeless film layer so that the voltage resistance will not be impaired.

It is preferred that a tensile strength of the intermediate layer be not lower than 200 MPa, more preferably not lower than 250 MPa. If the tensile strength is so low that it is lower than 200 MPa, the composite sheet may break due to a load applied thereto when performing automatic mounting or when in use. In the present invention, the tensile strength of the intermediate layer was measured in accordance with ASTM D882.

Examples of a material for the synthetic resin film layer as the intermediate layer having a thermal conductivity of not lower than 0.20 W/m·K and a tensile elastic modulus of not lower than 5 GPa, include an aromatic polyimide; a polyamide; a polyamideimide; a polyester such as polyethylene naphthalate; and fluorine-based polymers such as polytetrafluoroethylene (PTFE) and tetrafluoroethylene-perfluoroalkylvinylether copolymer. If using the above fluorine-based polymer(s) as the synthetic resin, it is preferred, in terms of adhesion improvement, that a chemical etching treatment be performed on the surface of the film obtained with a metal Na/naphthalene-based treatment liquid.

Among the synthetic resin films employing these materials, films made of aromatic polyimide, polyimide or polyamideimide have a high flame retardancy equivalent to V-0 in a flame retardant test performed in accordance with UL-94. Therefore, these films are suitable for use as an intermediate layer of a thermally conductive composite sheet used in electronic parts.

Further, as the synthetic resin film layer of the invention that has a thermal conductivity of not lower than 0.20 W/m·K, there may also be employed a thermally conductive synthetic resin film with an improved thermal conductivity and rigidity as a result of improving the crystallinity of the synthetic resin. Such synthetic resin film may be a polyimide film produced via condensation polymerization of biphenyltetracarboxylic acid dianhydride and diamine. A commercially available example thereof may be UPILEX-S (product name by Ube Industries, Ltd.)

It is favorable when the synthetic resin as the material of the synthetic resin film layer has a melting point of not lower than 200° C., preferably not lower than 250° C., because the synthetic resin film layer will exhibit a superior heat resistance, and hardly exhibit an impaired mechanical strength and a thermal deformation.

(B) Outer Layer

An outer layer included in the composite sheet of the invention is a silicone rubber layer prepared by curing a composition containing: (a) an organopolysiloxane; (b) a curing agent; (c) a thermally conductive filler; and (d) a silicon compound-based adhesion imparting agent having at least one kind of group selected from the group consisting of an epoxy group, an alkoxy group, a methyl group, a vinyl group and a Si—H group. The thickness of the layer (B) can be determined based on the application configuration and application target of the composite sheet of the invention. Although there are no particular restrictions on the thickness of the layer (B), it is preferred that such thickness be about 30 to 300 μm, particularly preferably about 50 to 200 μm. Overall, it is not preferable when the layer (B) is so thin that the thickness thereof is smaller than 30 μm or so thick that the thickness thereof is larger than 300 μm. Because when this thickness is smaller than 30 μm, the thermal conductivity of the composite sheet tends to deteriorate as a shape followability thereof to an electronic part(s) deteriorates; when this thickness is larger than 300 μm, the thermal conductivity and rigidity of the composite sheet tend to be impaired.

<(a) Organopolysiloxane>

The organopolysiloxane as the component (a) is represented by an average composition formula (1).

$$R^1_a SiO_{(4-a)/2} \quad (1)$$

In the formula (1), $R^1$ represents an identical or different substituted or unsubstituted monovalent hydrocarbon group having 1 to 10, preferably 1 to 8 carbon atoms; a represents a positive number of 1.90 to 2.05.

Examples of such $R^1$ include alkyl groups such as a methyl group, an ethyl group, a propyl group, a butyl group, a pentyl group, a hexyl group, a heptyl group, an octyl group, a nonyl group, a decyl group and an octadecyl group; cycloalkyl groups such as a cyclopentyl group and a cyclohexyl group; aryl groups such as a phenyl group, a tolyl group, a xylyl group and a naphthyl group; aralkyl groups such as a benzyl group, a phenethyl group and 3-phenylpropyl group; halogenated alkyl groups such as 3,3,3-trifluoropropyl group and 3-chloropropyl group; and alkenyl groups such as a vinyl group, an allyl group, a butenyl group, a pentenyl group and a hexenyl group.

It is preferred that the organopolysiloxane as the component (a) be that having a main chain composed of dimethylsiloxane units; or that in which a part of the methyl groups on such main chain have been substituted by, for example, vinyl group, phenyl group and/or 3,3,3-trifluoropropyl group. Further, the molecular chain end(s) of such organopolysiloxane may be that blocked by triorganosilyl group or hydroxyl group. The examples of the triorganosilyl group include a trimethylsilyl group, a dimethylvinylsilyl group and a trivinylsilyl group.

Further, it is preferred that a number-average polymerization degree of the organopolysiloxane as the component (a) be 200 to 12,000, particularly preferably 200 to 10,000. This organopolysiloxane may be in the form of an oil or a gum, whichever form may then be selected based on a molding method or the like. The number-average polymerization degree of the component (a) is a value obtained as, for example, a number-average polymerization degree in terms of polystyrene in a GPC (gel permeation chromatography) analysis using toluene or the like as a developing solvent.

As the component (a), organopolysiloxanes having the following chemical structures are favorably added depending on the type of the curing agent as the component (b) used in the invention.

When the curing agent as the component (b) is an addition reaction-type curing agent utilizing hydrosilylation reaction i.e. an addition reaction curing-type curing agent containing organohydrogenpolysiloxane and a platinum-based catalyst, the organopolysiloxane as the component (a) is an organopolysiloxane having at least two, preferably at least three silicon atom-bonded alkenyl groups in one molecule thereof. The composition obtained will not be cured sufficiently if the content of the silicon atom-bonded alkenyl groups is smaller than the lower limit of the above range i.e. less than two. Further, vinyl groups are preferable as the alkenyl groups bonded to silicon atoms. One or more alkenyl groups are bonded to any of the molecular chain end(s) and side chain(s), where a total of two or more alkenyl groups will suffice, and it is preferred that at least one alkenyl group be bonded to a silicon atom at a molecular chain end.

Specific examples in such case include a dimethylsiloxane/methylvinylsiloxane copolymer with both of its molecular chain ends blocked by a trimethylsiloxy group; a methylvinylpolysiloxane with both of its molecular chain ends blocked by a trimethylsiloxy group; a dimethylsiloxane/methylvinylsiloxane/methylphenylsiloxane copolymer with both of its molecular chain ends blocked by a trimethylsiloxy group; a dimethylpolysiloxane with both of its molecular chain ends blocked by a dimethylvinylsiloxy group; a methylvinylpolysiloxane with both of its molecular chain ends blocked by a dimethylvinylsiloxy group; a dimethylsiloxane/methylvinylsiloxane copolymer with both of its molecular chain ends blocked by a dimethylvinylsiloxy group; a dimethylsiloxane/methylvinylsiloxane/methylphenylsiloxane copolymer with both of its molecular chain ends blocked by a dimethylvinylsiloxy group; and a dimethylpolysiloxane with both of its molecular chain ends blocked by a trivinylsiloxy group. Any one of these examples may be used singularly, or two or more of them may be used in combination.

When the curing agent as the component (b) described later is an organic peroxide, although there are no particular restrictions on the organopolysiloxane as the component (a), it is preferred that the organopolysiloxane have in one molecule at least two alkenyl groups that are mentioned above.

Specific examples in such case include a dimethylpolysiloxane with both of its molecular chain ends blocked by a dimethylvinylsiloxy group; a dimethylpolysiloxane with both of its molecular chain ends blocked by a methylphenylvinylsiloxy group; a dimethylsiloxane/methylphenylsiloxane copolymer with both of its molecular chain ends blocked by a dimethylvinylsiloxy group; a dimethylsiloxane/methylvinylsiloxane copolymer with both of its molecular chain ends blocked by a dimethylvinylsiloxy group; a dimethylsiloxane/methylvinylsiloxane copolymer with both of its molecular chain ends blocked by a trimethylsiloxy group; a methyl(3,3,33-trifluoropropyl)polysiloxane with both of its molecular chain ends blocked by a dimethylvinylsiloxy group; a dimethylsiloxane/methylvinylsiloxane copolymer with both of its molecular chain ends blocked by a silanol group; and a dimethylsiloxane/methylvinylsiloxane/methylphenylsiloxane copolymer with both of its molecular chain ends blocked by a silanol group. Any one of these examples may be used singularly, or two or more of them may be used in combination.

<(b) Curing Agent>

Examples of the curing agent as the component (b) include an addition reaction-type curing agent utilizing hydrosilylation reaction; and an organic peroxide.

When the component (b) is an addition reaction-type curing agent utilizing hydrosilylation reaction, the curing agent is that comprised of an organohydrogenpolysiloxane having on average not less than two silicon atom-bonded hydrogen atoms in one molecule; and a platinum-based catalyst. Such organohydrogenpolysiloxane functions as a cross-linking agent capable of undergoing an addition reaction with the component (a) having the alkenyl groups.

Specific examples of this organohydrogenpolysiloxane include a methylhydrogenpolysiloxane with both of its molecular chain ends blocked by a trimethylsiloxy group; a dimethylsiloxane/methylhydrogensiloxane copolymer with both of its molecular chain ends blocked by a trimethylsiloxy group; a dimethylsiloxane/methylhydrogensiloxane/methylphenylsiloxane copolymer with both of its molecular chain ends blocked by a trimethylsiloxy group; a dimethylpolysiloxane with both of tis molecular chain ends blocked by a dimethylhydrogensiloxy group; a dimethylsiloxane/methylhydrogensiloxane copolymer with both of its molecular chain ends blocked by a dimethylhydrogensiloxy group; a dimethylsiloxane/methylphenylsiloxane copolymer with both of its molecular chain ends blocked by a dimethylhydrogensiloxy group; and a methylphenylpolysiloxane with both of its molecular chain ends blocked by a dimethylhydrogensiloxy group. Any one kind of such component (b) may be used singularly, or two or more kinds of them may be used in combination.

It is preferred that the organohydrogenpolysiloxane contained in such addition reaction-type curing agent utilizing hydrosilylation reaction be contained in an amount at which the silicon atom-bonded hydrogen atoms in the component (b) will be in an amount of 0.1 to 4.0 mol, particularly preferably 0.3 to 2.0 mol, per 1 mol of the silicon atom-bonded alkenyl groups in the component (a). When the amount of the silicon atom-bonded hydrogen atoms contained in the curing agent as the component (b) is so small that it is smaller than the lower limit in the above preferable range, there may occur a problem that, for example, a silicone rubber composition obtained will not be cured sufficiently. Meanwhile, when the amount of such hydrogen atoms contained is so large that it is larger than the upper limit in the above preferable range, there may occur a problem that, for example, a silicone rubber obtained will be extremely hard such that multiple cracks will occur on the surface thereof.

The platinum-based catalyst used together with the organohydrogenpolysiloxane is a catalyst for promoting the curing of the composition as the component (B). Examples of such platinum-based catalyst include chloroplatinic acid, an alcohol solution of chloroplatinic acid, an olefin complex of platinum, an alkenylsiloxane complex of platinum, and a carbonyl complex of platinum. In the present composition, there are no particular restrictions on the amount of the platinum-based catalyst used, and an effective amount as a catalyst will suffice. However, it is preferred that the platinum-based catalyst be used in an amount at which the platinum metal in the present component will be in an amount of 0.01 to 1,000 ppm, particularly preferably 0.1 to 500 ppm, in mass unit with respect to the component (a). If the amount of the platinum metal contained in the present component is so small that it is smaller than 0.01 ppm, the silicone rubber composition obtained may not be cured sufficiently. Meanwhile, even if the present component is used in an amount so large that the amount of the platinum metal contained in the catalyst is greater than 1,000 ppm, the curing speed of the silicone rubber composition obtained will not improve, whereas an economic disadvantage may occur.

When the curing agent as the component (b) is an organic peroxide, examples of such organic peroxide include benzoyl peroxide, dicumylperoxide, 2,5-dimethyl-2,5-bis(t-butylperoxy)hexane, di-t-butylperoxide and t-butyl perbenzoate. Any one of these organic peroxides may be used singularly, or two or more of them may be used in combination. It is preferred that such organic peroxide be added in an amount of 0.1 to 5 parts by mass, more preferably 1.0 to 3.5 parts by mass, per a total of 100 parts by mass of the organopolysiloxane as the component (a) and the later-described thermally conductive filler as the component (c). The silicone rubber composition may not be cured sufficiently, if the organic peroxide is added in an amount smaller than 0.1 parts by mass per the total of 100 parts by mass of the components (a) and (c). Meanwhile, if the organic peroxide is added in an amount of greater than 5 parts by mass per the total of 100 parts by mass of the components (a) and (c), there may occur a problem that, for example, the silicone rubber will be extremely hard such that multiple cracks will occur on the surface thereof.

<(c) Thermally Conductive Filler>

Preferable examples of the thermally conductive filler as the component (c) include inorganic powders such as powders of aluminum hydroxide, aluminum oxide, zinc oxide, silicon oxide, silicon carbide, aluminum nitride, boron nitride, magnesium oxide or diamond. Any one kind of such component (c) may be used singularly, or two or more kinds thereof may be used in combination.

It is preferred the powder of the thermally conductive filler as the component (c) have an average particle size of not larger than 50 μm, more preferably not larger than 20 μm. Here, the average particle size refers to a value (volume-based median diameter) determined by Microtrac MT3300EX (Nikkiso Co., Ltd.) as a laser diffraction/scattering particle size distribution measuring device.

Further, it is preferred that the component (c) be added in an amount of 100 to 1,800 parts by mass, more preferably 200 to 1,600 parts by mass, per 100 parts by mass of the component (a). If the amount of the component (c) added is so small that it is smaller than 100 parts by mass per 100 parts by mass of the component (a), the outer layer will exhibit an insufficient thermal conductivity. Meanwhile, if the amount of the component (c) added is so large that it is larger than 1,800 parts by mass per 100 parts by mass of the component (a), it may be difficult for the component (c) to be homogenously added to the composition such that a molding processability may be impaired.

<(d) Silicon Compound-Containing Adhesion Imparting Agent>

The component (d) is a critical component characterizing the thermally conductive silicone rubber composite sheet of the invention. By adding this component to the silicone rubber composition composing the outer layer, the silicone rubber layer as the outer layer (B) will exhibit a strong adhesiveness to the thermally conductive synthetic resin film layer as the intermediate layer (A) in a way such that delamination will not occur, and that an excellent durability will be exhibited with time. Further, since the invention employs the composition containing the component (d), there can be omitted a step of performing a primer treatment on the thermally conductive synthetic resin film layer as the intermediate layer (A), which is often performed to improve adhesion. Thus, the process for producing the composite sheet can be simplified; and a composite sheet with an unimpaired thermal conductivity can be obtained due to the absence of a primer layer.

As for the silicon compound-containing adhesion imparting agent as the component (d), it is required that the silicon compound contained therein be a silicon compound having at least one kind of group selected from the group consisting of an epoxy group, an alkoxy group, a methyl group, a vinyl group and a Si—H group. Particularly, preferred is a silicon compound having in one molecule at least two groups selected from the above group.

When the curing agent as the component (b) is the addition reaction-type reactive curing agent utilizing hydrosilylation reaction, it is preferred that the silicon compound in the component (d) have any one or both of vinyl group and Si—H group; and any one or both of epoxy group and alkoxy group. Further, when the curing agent as the component (b) is the organic peroxide, it is preferred that the silicon compound in the component (d) have any one or both of methyl group and vinyl group; and any one or both of epoxy group and alkoxy group.

It is preferred that the component (d) be added in an amount of 0.1 to 3.0 parts by mass, particularly preferably 0.5 to 2.0 parts by mass, per a total of 100 parts by mass of the components (a) and (c). If the amount of the component (d) added is so small that it is smaller than 0.1 parts by mass, the adhesion imparting effect will not be exhibited. Further, it is not favorable if the amount of the component (d) added is so large that it is greater than 3.0 parts by mass, because there will occur a problem that mechanical properties will be impaired.

Specific examples of such silicon compound having at least one kind of group selected from the group consisting of an epoxy group, an alkoxy group, a methyl group, a vinyl group and a Si—H group depending on the type of the component (b) employed, include but are not limited to those represented by the following structural formulae (2) to (6).

[Chemical formula 1]

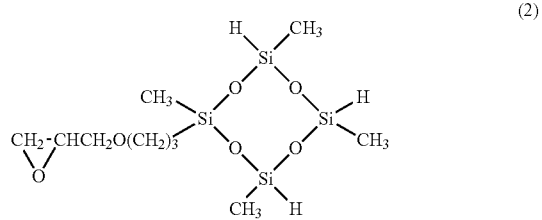

(2)

[Chemical formula 2]

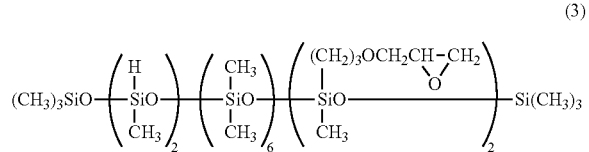

(3)

[Chemical formula 3]

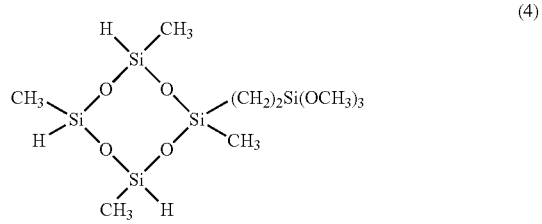

(4)

[Chemical formula 4]

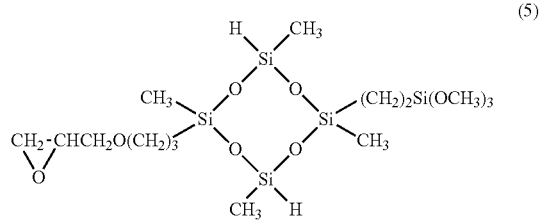

(5)

-continued

[Chemical formula 5]

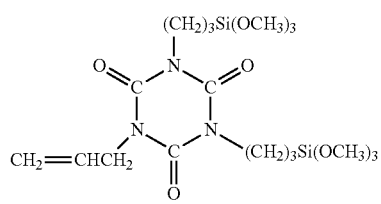

(6)

One kind of the component (d) may be used singularly, or two or more kinds thereof may be used in combination.

Method for producing thermally conductive silicone rubber composite sheet

Described hereunder is an example of a method for producing the thermally conductive silicone rubber composite sheet of the present invention. However, the production method of the invention is not limited to the following example.

Preparation of Coating Composition for Use in Outer Layer (B)

In the beginning, the organopolysiloxane as the component (a) and the thermally conductive filler as the component (c) are kneaded together using a mixer such as a kneader, a Banbury mixer, a planetary mixer or a Shinagawa mixer, while being heated to a temperature of about 100° C. or higher if necessary. In this kneading step, if desired, there may also be added and mixed, for example, a reinforcing silica such as a fumed silica and a precipitated silica; a silicone oil, a silicone wetter or the like; and/or a flame retardant such as platinum, titanium oxide and benzotriazole, without impairing the thermal conductivity of the outer layer.

After cooling the homogenous mixture obtained in the kneading step to a room temperature, the mixture is then filtrated through a strainer or the like, followed by using a double roll mill, a Shinagawa mixer or the like to add to such mixture given amounts of the adhesion imparting agent as the component (d) as well as the curing agent as the component (b) to further perform kneading. In such second kneading step, there may also be added and mixed, for example, an acetylene compound-based addition reaction inhibitor such as 1-ethynyl-1-cyclohexanol; a colorant such as an organic colorant and an inorganic colorant; and/or a heat resistance improver such as ferric oxide and cerium oxide.

The outer layer composition obtained in the second kneading step may be directly subjected to the next step as an outer layer coating agent. However, if necessary, a solvent such as toluene may be further added to the above outer layer composition, followed by putting such composition into a mixer such as a planetary mixer or a kneader to mix the same so that the mixed product may then be employed as the outer layer coating agent.

Coating Step

Both surfaces of the thermally conductive synthetic resin film layer as the intermediate layer (A) are to be successively coated with a given and continuous thickness of the outer layer coating agent obtained in the step for preparing the above coating composition, using a coating device such as a knife coater or kiss coater equipped with a drying furnace, a heating furnace and a winding device. The solvent or the like is then dried and evaporated, followed by performing heating at about 80 to 200° C., preferably about 100 to 150° C. if the outer layer coating agent is an addition reaction curing-type agent containing the addition reaction-type curing agent utilizing hydrosilylation reaction; or at about 100 to 200° C., preferably about 110 to 180° C. if the outer layer coating agent is a peroxide curing-type agent containing the organic peroxide as the curing agent. In this way, crosslinking and curing takes place so that there can be obtained the thermally conductive silicone rubber composite sheet of the invention having an excellent thermal conductivity, electrical insulation property, mechanical strength, flexibility, heat resistance and durability.

The thermally conductive silicone rubber composite sheet of the invention is not necessarily limited to a triple-layered laminate; if desired, the composite sheet may, for example, have a five-layered structure composed of the layers (A) and (B) in a manner such that the layers are stacked in an order of (B)/(A)/(B)/(A)/(B), or the composite sheet may also contain a layer(s) of, for example, a glass cloth, a graphite sheet and/or aluminum foil.

It is preferred that the composite sheet of the invention have a thickness of 100 to 500 μm, particularly preferably 100 to 300 μm. If the composite sheet is so thick that the thickness thereof is greater than 500 μm, the rigidity of the composite sheet of the invention will be impaired, which makes it difficult for the composite sheet to be used in automatic mounting. Further, the composite sheet may be unsuitable for use due to a deteriorated thermal conductivity when the thickness of the composite sheet is greater than 500 μm.

WORKING EXAMPLE

The present invention is described in detail hereunder with reference to working and comparative examples. However, the invention is not limited to the following working examples. Further, in the working examples, the thermal conductivity of the thermally conductive synthetic resin film as the intermediate layer is a value measured by a thermal resistance measuring device utilizing laser flash method (LFA 447 NanoFlash as a xenon flash analyzer by NETZSCH) at 25° C., and is thus a value measured by the company of the applicant. One surface of each synthetic resin film was spray-coated with carbon, and the measurement was then performed on such surface.

Working Example 1

Here, (a) 100 parts by mass of a dimethylpolysiloxane with both ends blocked by a dimethylvinylsiloxy group and having an average polymerization degree of 8,000; and (c) 300 parts by mass of an aluminum hydroxide powder having an average particle size of 8 μm as well as 100 parts by mass of an aluminum hydroxide powder having an average particle size of 1 μm, as thermally conductive fillers, were kneaded together in a Banbury mixer at room temperature for 40 min, followed by using a 100 mesh strainer to filtrate the kneaded product. Later, further added to and kneaded together with 100 parts by mass of the mixture of the components (a) and (c), using a double roll mill, were: 1.5 parts by mass of (d) a silicon compound serving as an adhesion imparting agent and represented by the following structural formula (6)

[Chemical formula 6]

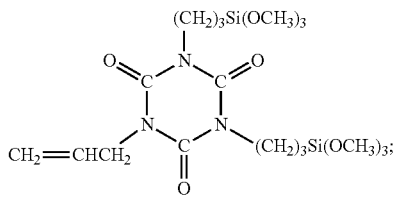

(6)

[Chemical formula 7]

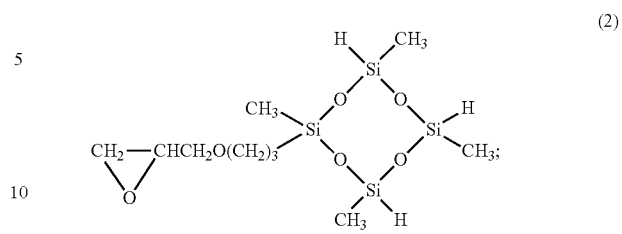

(2)

2.0 parts by mass of (b) di(2-methylbenzoyl)peroxide as an organic peroxide; and 0.4 parts by mass of KE-color-R20 (product name by Shin-Etsu Chemical Co., Ltd.) as a colorant, and a mixture was thus obtained.

Next, 100 parts by mass of the mixture obtained above was dissolved in 50 parts by mass of toluene to produce a coating agent. In the beginning, one surface of a highly rigid and highly thermal conductive aromatic polyimide-based film (product name: UPILEX-75S by Ube Industries, Ltd., thermal conductivity: 0.25 W/m·K, tensile elastic modulus: 6.9 GPa, thickness: 75 μm) was coated with the coating agent, followed by curing the same under a condition of drying temperature: 80° C., curing temperature: 150° C., thereby obtaining a rubber layer formed into a thickness of 62.5 μm. Subsequently, the other surface was also coated, dried and cured in a similar manner to produce a thermally conductive silicone rubber composite sheet having a total thickness of 200 μm.

Working Example 2

A thermally conductive silicone rubber composite sheet having a total thickness of 200 μm was produced in a similar manner as the working example 1, except that the aluminum hydroxide powders as the component (c) were changed to 750 parts by mass of an aluminum oxide powder having an average particle size of 8 μm as well as 200 parts by mass of an aluminum oxide powder having an average particle size of 1 μm.

Working Example 3

Here, (a) 100 parts by mass of a dimethylpolysiloxane with both ends blocked by a dimethylvinylsiloxy group and having a viscosity of 600 mm²/s at 25° C.; and (c) 750 parts by mass of an aluminum oxide powder having an average particle size of 4 μm as well as 250 parts of a boron nitride powder having an average particle size of 9 μm, as thermally conductive fillers, were kneaded together in a planetary mixer at room temperature for 20 min, followed by using a 100 mesh strainer to filtrate the kneaded product. Later, homogenously added to 100 parts by mass of the mixture of the components (a) and (c) were: 2.0 parts by mass of a silicon compound serving as an adhesion imparting agent and represented by the following structural formula (2)

and 0.35 parts by mass of (b1) a vinylsiloxane complex of chloroplatinic acid (platinum metal content: 1% by mass). Next, there were added 0.06 parts by mass of 1-ethynyl-1-cyclohexanol as an addition reaction inhibitor; and then 1.5 parts by mass of a methylhydrogenpolysiloxane (Si—H group content: 0.0050 mol/g) (Si—H groups/vinyl groups in (a) (molar ratio): 4.0) represented by the following structural formula (7)

[Chemical formula 8]

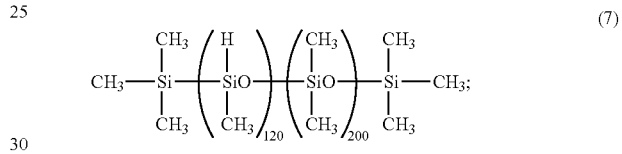

(7)

as well as 0.4 parts by mass of KE-color-R20 (product name by Shin-Etsu Chemical Co., Ltd.) as a colorant. After performing mixing homogeneously, a silicone rubber composition was obtained.

Next, 100 parts by mass of the mixture obtained above was dissolved in 15 parts by mass of toluene to produce a coating agent. In the beginning, one surface of a highly rigid and highly thermal conductive aromatic polyimide-based film (product name: UPILEX-50S by Ube Industries, Ltd., thermal conductivity: 0.24 W/m·K, tensile elastic modulus: 9.1 GPa, thickness: 50 μm) was coated with the coating agent, followed by treating the same under the condition of drying temperature: 80° C., curing temperature: 150° C., thereby obtaining a rubber layer formed into a thickness of 50 μm. Subsequently, the other surface was also coated, dried and cured in a similar manner to produce a thermally conductive silicone rubber composite sheet having a total thickness of 150 μm.

Comparative Example 1

A thermally conductive silicone rubber composite sheet having a total thickness of 200 μm was produced in a similar manner as the working example 1, except that employed as the intermediate layer was an aromatic polyimide-based film (product name: Kapton 300H by DU PONT-TORAY CO., LTD., thermal conductivity: 0.12 W/m·K, tensile elastic modulus: 3.4 GPa, thickness: 75 μm).

Comparative Example 2

A thermally conductive silicone rubber composite sheet having a total thickness of 150 μm was produced in a similar manner as the working example 3, except that employed as the intermediate layer was a polyethylene terephthalate-based film (product name: Lumirror S10 #50 by DU PONT- TORAY CO., LTD., thermal conductivity: 0.12 W/m·K, tensile elastic modulus: 4.0 GPa, thickness: 50 μm).

Comparative Example 3

A thermally conductive silicone rubber composite sheet having a total thickness of 200 μm was produced in a similar manner as the working example 1, except that there were not added the 1.5 parts by mass of (d) the silicon compound as the adhesion imparting agent.

Comparative Example 4

A thermally conductive silicone rubber composite sheet having a total thickness of 200 μm was produced in a similar manner as the working example 1, except that employed as the intermediate layer was a highly thermal conductive aromatic polyimide-based film filled with a filler (product name: Kapton 300MT by DU PONT-TORAY CO., LTD., thermal conductivity: 0.26 W/m·K, tensile elastic modulus: 3.4 GPa, thickness: 75 μm).

Table 1 shows the compositions of the mixtures of the components (a) and (c); and the compositions of the coating agents, in the working examples 1 to 3 and the comparative examples 1 to 4. The numerical value with regard to each component in Table 1 represents an amount expressed as part by mass.

Methods for Evaluating Various Properties

Various properties of each composite sheet produced in the working examples 1 to 3; and comparative examples 1 to 4, were measured by the following methods. The measurement results thereof are shown in Table 1.

Adhesion Strength

Adhesion strength was measured by performing an 180° peel test in accordance with JIS K 6854. As a test sample, produced was a double-layered sample in which a rubber layer having a thickness of 1 mm was formed on one surface of an aromatic polyimide-based film having a thickness of 25 μm.

Thermal Resistance

Thermal resistance was measured under a condition of 50° C./100 psi in accordance with ASTM D 5470.

Automatic Mounting Adaptability

The composite sheet cut into a size of 40×40 mm was picked up by a test device in a way such that the edge portion on one side of the sheet was picked up. There, whether deflection would occur to the sheet when picked up was visually confirmed. As for evaluation, "x" was given when deflection had occurred, whereas "o" was given when deflection had barely occurred.

TABLE 1

|  |  | Working example | | | Comparative example | | | |
|---|---|---|---|---|---|---|---|---|
|  |  | 1 | 2 | 3 | 1 | 2 | 3 | 4 |
| Intermediate layer | | UPILEX-755 | UPILEX-755 | UPILEX-505 | Kapton 300H | Lumirror S10 #50 | UP ILEX-755 | Kapton 300MT |
| Thickness of intermediate layer (μm) | | 75 | 75 | 50 | 75 | 50 | 75 | 75 |
| * Resin structure of intermediate layer | | A | A | A | B | C | A | B |
| ** Tensile elastic modulus of intermediate layer (GPa) | | 6.9 | 6.9 | 9.1 | 3.4 | 4.0 | 6.9 | 3.4 |
| ** Tensile strength of intermediate layer (MPa) | | 360 | 360 | 455 | 159 | 215 | 360 | 159 |
| *** Thermal conductivity of intermediate layer (W/m · K) | | 0.25 | 0.25 | 0.24 | 0.12 | 0.12 | 0.25 | 0.26 |
| (a) + (c)Mixture | (a)Organopolysiloxane | 100 | 100 | 100 | 100 | 100 | 100 | 100 |
|  | (c)Thermally conducive filler | 400 | 950 | 1000 | 400 | 400 | 400 | 400 |
| Coating agent | (a) + (c) | 100 | 100 | 100 | 100 | 100 | 100 | 100 |
|  | (d)Adhesion imparting agent | 1.5 | 1.5 | 2.0 | 1.5 | 1.5 | 0 | 1.5 |
|  | ****(b)Curing agent | 2.0 | 2.0 | 1.5(*) | 2.0 | 2.0 | 2.0 | 2.0 |
|  | Colorant | 0.4 | 0.4 | 0.4 | 0.4 | 0.4 | 0.4 | 0.4 |
| Property | Thickness (μm) | 200 | 200 | 150 | 200 | 150 | 200 | 200 |
|  | Adhesion strength (N/cm) | 26.3 (Fracture) | 20.6 (Fracture) | 21.3 (Fracture) | 35.1 (Fracture) | 28.6 (Fracture) | 3.8 (Peeling) | 22.3 (Fracture) |
|  | Thermal resistance (cm² · K/W) | 3.7 | 3.4 | 2.6 | 5.7 | 3.8 | 3.8 | 3.4 |
|  | Automatic mounting adaptability | o | o | o | x | x | o | x |

Note*

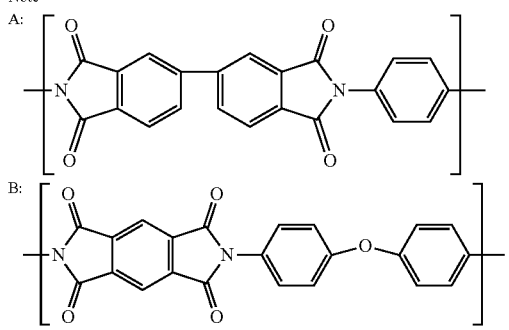

TABLE 1-continued

| | Working example | | | Comparative example | | | |
|---|---|---|---|---|---|---|---|
| | 1 | 2 | 3 | 1 | 2 | 3 | 4 |

C:

Note**:
Catalog value
Note***:
Value measured by Laser-Flash method
Note****:
Amount of curing agent (b) in working example 3 is amount of methylhydrogenpolysiloxane added As shown in Table 1, it was confirmed that each laminated structure body in the working examples 1 to 3 had its layers sufficiently adhering to one another, and that the laminated structure body was thus suitable for use in automatic mounting. In contrast, it became clear that deflection had occurred to the laminated structure bodies in the comparative examples 1, 2 and 4 when they were picked up by the device, and that these laminated structure bodies were thus not suitable for use in automatic mounting. Further, it became clear that although the level of deflection observed in the comparative example 3 was relatively low, interlayer peeling could have easily occurred in the comparative example 3 as compared to the working examples 1 to 3.

INDUSTRIAL APPLICABILITY

The thermally conductive silicone rubber composite sheet of the present invention is useful as a heat dissipation member that is to be interposed between a heat-generating electronic part and a heat dissipation part.

The invention claimed is:

1. A thermally conductive silicone rubber composite sheet including a laminated structure body comprised of an intermediate layer and an outer layer laminated on both surfaces of the intermediate layer, wherein
  (A) the intermediate layer is an electrically insulating synthetic resin film layer having a thermal conductivity of not lower than 0.20 W/m·K, a tensile elastic modulus of not lower than 5 GPa, and a thickness of 50 to 100 μm, and
  (B) the outer layer is a silicone rubber layer of a cured product of a composition containing: (a) an organopolysiloxane; (b) a curing agent; (c) a thermally conductive filler; and (d) a silicon compound-based adhesion imparting agent having at least one kind of group selected from the group consisting of an epoxy group, an alkoxy group, a methyl group, a vinyl group and a Si—H group.

2. The thermally conductive silicone rubber composite sheet according to claim 1, wherein the thermally conductive silicone rubber composite sheet has a total thickness of not larger than 300 μm.

3. The thermally conductive silicone rubber composite sheet according to claim 1, wherein the intermediate layer has a tensile strength of not lower than 200 MPa.

4. The thermally conductive silicone rubber composite sheet according to claim 1, wherein a synthetic resin used in the synthetic resin film layer is an aromatic polyimide, a polyamide, a polyamideimide, a polyester or a fluorine-based polymer; or a combination of two or more of them.

5. The thermally conductive silicone rubber composite sheet according to claim 1, wherein a synthetic resin used in the synthetic resin film layer is a polyimide as a polycondensate of biphenyltetracarboxylic acid dianhydride and diamine.

6. The thermally conductive silicone rubber composite sheet according to claim 1, wherein a powder as the thermally conductive filler is a zinc oxide powder, an aluminum oxide powder, a magnesium oxide powder, an aluminum hydroxide powder, a boron nitride powder, an aluminum nitride powder, a silicon oxide powder, a silicon carbide powder or a diamond powder; or a combination of two or more of them.

7. The thermally conductive silicone rubber composite sheet according to claim 1, wherein the curing agent as the component (b) is an addition reaction-type curing agent utilizing hydrosilylation reaction, and the silicon compound-based adhesion imparting agent as the component (d) has any one or both of a vinyl group and a Si—H group; and any one or both of an epoxy group and an alkoxy group.

8. The thermally conductive silicone rubber composite sheet according to claim 1, wherein the curing agent as the component (b) is an organic peroxide, and the silicon compound-based adhesion imparting agent as the component (d) has any one or both of a methyl group and a vinyl group; and any one or both of an epoxy group and an alkoxy group.

9. The thermally conductive silicone rubber composite sheet according to claim 2, wherein the intermediate layer has a tensile strength of not lower than 200 MPa.

10. The thermally conductive silicone rubber composite sheet according to claim 2, wherein a synthetic resin used in the synthetic resin film layer is an aromatic polyimide, a polyamide, a polyamideimide, a polyester or a fluorine-based polymer; or a combination of two or more of them.

11. The thermally conductive silicone rubber composite sheet according to claim 3, wherein a synthetic resin used in the synthetic resin film layer is an aromatic polyimide, a polyamide, a polyamideimide, a polyester or a fluorine-based polymer; or a combination of two or more of them.

12. The thermally conductive silicone rubber composite sheet according to claim 9, wherein a synthetic resin used in the synthetic resin film layer is an aromatic polyimide, a polyamide, a polyamideimide, a polyester or a fluorine-based polymer; or a combination of two or more of them.

13. The thermally conductive silicone rubber composite sheet according to claim 2, wherein a synthetic resin used in the synthetic resin film layer is a polyimide as a polycondensate of biphenyltetracarboxylic acid dianhydride and diamine.

14. The thermally conductive silicone rubber composite sheet according to claim 3, wherein a synthetic resin used in the synthetic resin film layer is a polyimide as a polycondensate of biphenyltetracarboxylic acid dianhydride and diamine.

15. The thermally conductive silicone rubber composite sheet according to claim 9, wherein a synthetic resin used in the synthetic resin film layer is a polyimide as a polycondensate of biphenyltetracarboxylic acid dianhydride and diamine.

16. The thermally conductive silicone rubber composite sheet according to claim 2, wherein a powder as the thermally conductive filler is a zinc oxide powder, an aluminum oxide powder, a magnesium oxide powder, an aluminum hydroxide powder, a boron nitride powder, an aluminum nitride powder, a silicon oxide powder, a silicon carbide powder or a diamond powder; or a combination of two or more of them.

17. The thermally conductive silicone rubber composite sheet according to claim 3, wherein a powder as the thermally conductive filler is a zinc oxide powder, an aluminum oxide powder, a magnesium oxide powder, an aluminum hydroxide powder, a boron nitride powder, an aluminum nitride powder, a silicon oxide powder, a silicon carbide powder or a diamond powder; or a combination of two or more of them.

18. The thermally conductive silicone rubber composite sheet according to claim 4, wherein a powder as the thermally conductive filler is a zinc oxide powder, an aluminum oxide powder, a magnesium oxide powder, an aluminum hydroxide powder, a boron nitride powder, an aluminum nitride powder, a silicon oxide powder, a silicon carbide powder or a diamond powder; or a combination of two or more of them.

19. The thermally conductive silicone rubber composite sheet according to claim 5, wherein a powder as the thermally conductive filler is a zinc oxide powder, an aluminum oxide powder, a magnesium oxide powder, an aluminum hydroxide powder, a boron nitride powder, an aluminum nitride powder, a silicon oxide powder, a silicon carbide powder or a diamond powder; or a combination of two or more of them.

* * * * *